United States Patent [19]

Brienza

[11] 4,363,027

[45] Dec. 7, 1982

[54] TOUCH SENSITIVE CONTROL PANEL UTILIZING PYROELECTRIC MATERIAL

[75] Inventor: Michael J. Brienza, Ridgewood, N.J.

[73] Assignee: The Singer Company, Stamford, Conn.

[21] Appl. No.: 267,971

[22] Filed: May 28, 1981

Related U.S. Application Data

[62] Division of Ser. No. 119,691, Feb. 8, 1980, Pat. No. 4,307,383.

[51] Int. Cl.³ .............................................. G06F 3/02
[52] U.S. Cl. ............................. 340/365 R; 112/158 E; 307/117
[58] Field of Search ....................... 340/365 R, 365 C; 112/158 E; 307/117; 337/298; 178/17 C; 179/90 K

[56] References Cited

U.S. PATENT DOCUMENTS 4,078,257  3/1978  Bagley ............................ 340/365 R
4,123,631  10/1978  Lewis ............................. 340/365 C
4,234,813  11/1980  Iguchi et al. .................... 340/365 R Primary Examiner—James J. Groody
Attorney, Agent, or Firm—David L. Davis; Robert E. Smith; Edward L. Bell

[57] ABSTRACT

A touch sensitive control panel utilizing pyroelectric material to provide output signals representative of an area touched by an operator includes a plurality of conductors and areas of pyroelectric material selectively in contact with the conductors to provide a binary coded combination of voltage pulses on the conductors representative of a touched area of the control panel.

1 Claim, 4 Drawing Figures

TOUCH SENSITIVE CONTROL PANEL UTILIZING PYROELECTRIC MATERIAL

This application is a division of application Ser. No. 119,691, filed Feb. 8, 1980, now U.S. Pat. No. 4,307,383.

DESCRIPTION

BACKGROUND OF THE INVENTION

This invention relates to control panels for appliances and the like and, more particularly, to a touch sensitive control panel which provides a binary coded output signal in response to a body portion of an operator touching a selected area of the panel.

Many domestic appliances, such as, for example, sewing machines, microwave ovens, televisions, etc., are presently constructed with touch sensitive control panels. Such control panels typically respond to the capacitive effect of a user's touch for both controlling the operation of the appliance and for providing visual feedback to the operator of such operation. A problem with such a control panel is that it does not provide output signals which may be directly utilized by the appliance control circuitry and therefore a substantial amount of interface circuitry between the control panel and the control system is required.

It is therefore a primary object of this invention to provide a control panel of the type having a plurality of touch sensitive areas in proximate relationship to corresponding functional indicia which provides output signals which may be directly utilized by the control circuitry of the appliance.

A further object of this invention is to provide such a control panel wherein the output signals are in a binary coded format.

SUMMARY OF THE INVENTION

The foregoing and additional objects are attained in accordance with the principles of this invention by providing a control panel for an appliance including means for presenting to an operator of the appliance indicia representative of the operating capabilities, functions and conditions of the appliance. A plurality of conductors are provided which extend along the presenting means past all the indicia and a plurality of areas of pyroelectric material are arranged on the presenting means in registration with the indicia and are selectively connected to the conductors so that an operator touching a selected one of the indicia causes a binary coded combination of output signals to be established on the conductors.

BRIEF DESCRIPTION OF THE DRAWINGS

The foregoing will be more readily apparent upon reading the following description in conjunction with the drawings wherein.

DETAILED DESCRIPTION

Figure 1:
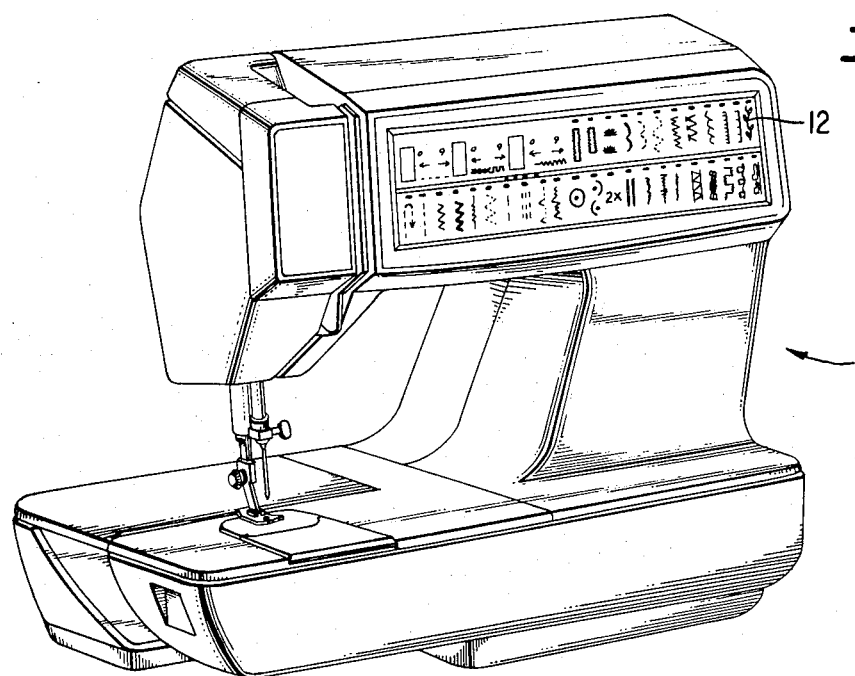
FIG. 1 is a perspective view of a sewing machine having a touch control panel of the type to which the present invention relates.

Referring now to the drawings, wherein like elements in different figures thereof have the same reference character applied thereto, FIG. 1 illustrates a sewing machine indicated generally at 10 having a control panel 12 of the type to which this invention relates. Typically, a prior art version of the control panel 12 utilizes a continuous planar element such as a glass panel to which circuitry is applied as by deposition or the like to provide controls sensitive to the touch of an operator's finger. Visible on the panel 12 are indicia representative of the operating capabilities, functions and conditions of the sewing machine 10. In proximate relation to the indicia, although not visible in FIG. 1, are touch sensitive areas which provide means for sensing an operator's touch. In the prior art, such sensing means responds to a change in capacitance. The control panel 12 may be back lit and presents a "dead front" when not lit.

In accordance with the principles of this invention, sensing is accomplished through the medium of a pyroelectric material. Such a material has the property that it responds to a rate of change of temperature to provide an output voltage thereacross. It has been observed that a voltage pulse greater than two volts can be obtained when a body portion of an operator, such as a finger, touches such a material. Voltage pulses of this magnitude can be handled directly by microelectronic logic chips.

Figure 2:
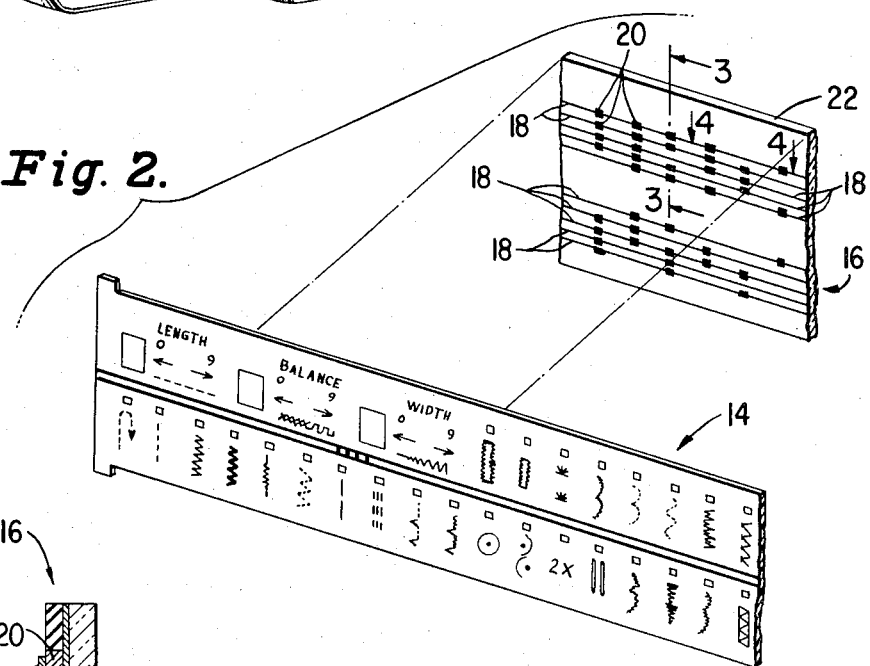
FIG. 2 is a disassembled perspective view of a portion of an improved touch control panel constructed in accordance with the principles of this invention.

Accordingly, FIG. 2 illustrates an illustrative embodiment of this invention wherein the control panel 12 includes a graphics display member 14 and a support member 16. The graphics display member 14 presents to an operator of the appliance indicia representative of the operating capabilities, functions and conditions of the appliance and preferably is a relatively thin sheet of material having the indicia printed on a surface thereof. The rear surface of the graphics display member 14 is adhered to the front surface of the support member 16. A plurality of non-intersecting elongated conductors 18 are deposited on the support member 16 and extend past all the indicia printed on the graphics display member. A plurality of areas 20 of pyroelectric material are formed on the support member 16 in registration with the indicia and are selectively connected to the conductors 18 depending upon which indicium they are in registration with so as to provide an assigned binary code for that indicium on the conductors 18.

Figure 3:
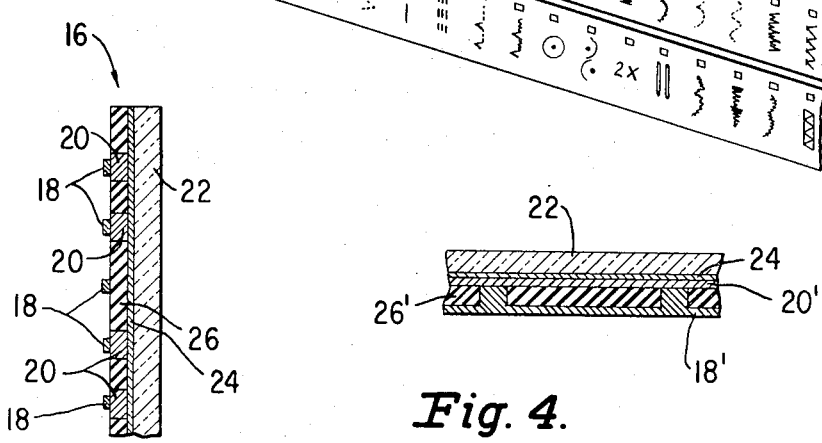
FIG. 3 is a cross-sectional view of a first embodiment of this invention taken along the lines 3—3 in FIG. 2.

Referring now to FIG. 3, in a first embodiment of this invention, the support member 16 is seen to illustratively comprise a glass, or other convenient transparent material if back lighting is desired, backing member 22 having a conductive layer 24, preferably zinc oxide, deposited thereon. If back lighting is not desired, layers 22 and 16 can be replaced by a metal substrate. A layer 26 of insulative material is deposited on top of the conductive layer 24 except in regions where pads of the pyroelectric material 20 are deposited. The conductors 18 are then deposited over the insulative layer 26.

Figure 4:
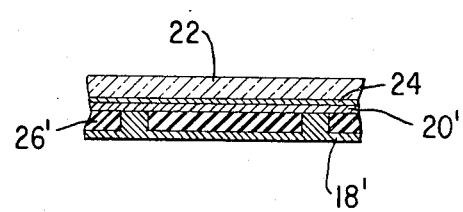
FIG. 4 is a cross-sectional view of a second embodiment of this invention taken along the lines 4—4 in FIG. 2.

Referring to FIG. 4, in a second embodiment of this invention, a film layer 20' of pyroelectric material is deposited to cover the entire conductive layer 24 which is on the backing member 22. The layer 26' of insulative material then selectively exposes areas of the pyroelectric layer 20' and the conductors 18' extend into the exposed areas to contact the pyroelectric material 20' only in those areas. These areas correspond to the binary code assigned to the indicium they are in registration with.

A typical pyroelectric material which may be utilized is lithium tantalate which responds to a time rate of change of temperature to provide a voltage between the conductive layer 24, which acts as a ground plane, and the conductors 18. A more cost effective material would be of the type that can be deposited in a film form. These are known in the art and are commercially available. Ambient temperature changes are so slow that the control panel 12 is insensitive to background changes and will only respond when an operator's finger is applied to a selected indicium on the graphic display member 14, which conducts heat from the operator's finger therethrough to the coded group of pyroelectric areas 20 which are in registration with the selected indicium. A plurality of voltage pulses are then applied to the conductors 18 to provide a binary coded indication of which of the indicia has been touched.

Accordingly, there has been disclosed an improved touch sensitive control panel. It is understood that the above-described embodiments are merely illustrative of the application of the principles of this invention. Numerous other embodiments may be devised by those skilled in the art without departing from the spirit and scope of this invention, as defined by the appended claims. For example, a matrix array of conductors may be utilized with a pyroelectric film placed between the conductors at the intersection points of the row and column conductors.

I claim:

1. A control panel for an appliance having a multiplicity of operating capabilities, functions and conditions, said control panel comprising:
   a backing member;
   a layer of conductive material on a surface of said backing member;
   a layer of pyroelectric material on said conductive layer;
   a layer of insulative material on said pyroelectric layer, said insulative layer leaving selected areas of said pyroelectric layer exposed;
   a plurality of non-intersecting elongated conductors on said insulative layer; and
   a graphics display member overlying said conductors, said graphics display member having indicia thereon representative of said operating capabilities, functions and conditions of said appliance;
   said selected areas of exposed pyroelectric material being located in registration with said indicia and selectively in contact with said conductors so that a binary coded combination of voltage pulses is applied to said conductors in response to a body portion of an operator touching one of said indicia, each of said indicia corresponding to a unique respective binary code.

* * * * *